(12) United States Patent
Ciplickas et al.

(10) Patent No.: US 7,348,594 B2
(45) Date of Patent: Mar. 25, 2008

(54) TEST STRUCTURES AND MODELS FOR ESTIMATING THE YIELD IMPACT OF DISHING AND/OR VOIDS

(75) Inventors: Dennis J. Ciplickas, San Jose, CA (US); Brian E. Stine, Santa Clara, CA (US); Yanwen Fei, Fairfax, VA (US)

(73) Assignee: PDF Solutions, Inc., San Jose, CA (US)

( * ) Notice: Subject to any disclaimer, the term of this patent is extended or adjusted under 35 U.S.C. 154(b) by 393 days.

(21) Appl. No.: 10/492,513

(22) PCT Filed: Aug. 30, 2002

(86) PCT No.: PCT/US02/27774

§ 371 (c)(1),
(2), (4) Date: Oct. 8, 2004

(87) PCT Pub. No.: WO03/028412

PCT Pub. Date: Apr. 3, 2003

(65) Prior Publication Data

US 2005/0074908 A1     Apr. 7, 2005

Related U.S. Application Data

(60) Provisional application No. 60/316,317, filed on Aug. 31, 2001.

(51) Int. Cl.
*H01L 23/58* (2006.01)
*H01L 21/66* (2006.01)

(52) U.S. Cl. .................... 257/48; 438/14; 257/E23.002

(58) Field of Classification Search .................. 257/48; 438/14
See application file for complete search history.

(56) References Cited

U.S. PATENT DOCUMENTS

| 3,983,479 A | 9/1976 | Lee et al. |
| 4,855,253 A | 8/1989 | Weber et al. |
| 5,051,690 A * | 9/1991 | Maly et al. .................... 257/48 |

(Continued)

OTHER PUBLICATIONS

Ahmadi et al., A Model for Mechanical Wear and Abrasive Particle Adhesion during the Chemical Mechanical Polishing Process, Journal of The Electrochemical Society (2001), pp. G99-G109:148(3).

(Continued)

*Primary Examiner*—Evan Pert
(74) *Attorney, Agent, or Firm*—Duane Morris, LLP; Steven E Koffs

(57) ABSTRACT

A test structure comprising a test pattern is formed on a substrate. The test pattern includes a first comb structure having a plurality of tines, and a second structure. The second structure may be a snake structure having a plurality of side walls or a second comb structure having a plurality of side walls. The tines of the first comb structure are positioned within side walls of the snake structure or second comb structure. The tines of the first comb structure are offset from a center of the side walls. Test data collected from the test structure are analyzed, to estimate product yield. The test structure may have a lower layer pattern, such that topographical variations of the lower layer pattern propagate to an upper layer pattern of the test structure.

15 Claims, 12 Drawing Sheets

U.S. PATENT DOCUMENTS

| | | | |
|---|---|---|---|
| 5,723,874 | A | 3/1998 | Baker et al. |
| 6,261,956 | B1 | 7/2001 | Shields |
| 6,362,634 | B1 | 3/2002 | Jarvis et al. |
| 6,403,389 | B1* | 6/2002 | Chang et al. ............... 438/18 |
| 6,577,149 | B2* | 6/2003 | Doong et al. ............ 324/765 |
| 6,623,995 | B1* | 9/2003 | Chen et al. ................ 438/14 |
| 6,873,146 | B2* | 3/2005 | Liu ....................... 324/158.1 |
| 2002/0089345 | A1* | 7/2002 | Doong et al. ............ 324/765 |
| 2002/0151093 | A1 | 10/2002 | Woo et al. |
| 2003/0020503 | A1 | 1/2003 | Weiland et al. |
| 2003/0020507 | A1 | 1/2003 | Song et al. |
| 2003/0145292 | A1* | 7/2003 | Stine et al. .................. 716/4 |

OTHER PUBLICATIONS

Buehler, M. G., Microelectronic Test Chips for VLSI Electronics, VLSI Electronics: Microstructures Science (1983), pp. 529-576, vol. 6, Chap. 9, Academic Press.

Chen et al., Pattern Planarization Model of Chemical Mechanical Polishing, Journal of The Electrochemical Society, (1999), pp. 744-748, 146 (2).

Ciplickas et al., "Predictive Yield Modeling of VLSIC's", IEEE International Workshop on Statistical Metrology, Jun. 2000, Honolulu, HI.

Gan et al., Modeling of Reverse Tone Etchback Shallow Trench Isolation Chemical Mechanical Polishing, Journal of The Electrochemical Society, (2001), pp. G159-G165 148 (3).

Gotkis et al., Selectivity Switch Concept in Cu chemical mechanical planarization and its implementation on orbital tools, J. Vac. Sci. Technol., (Sep./Oct. 1999), pp. 2262-2271, B 17(5).

Ipri et al., Integrated Circuit Process and Design Rule Evaluation Techniques, RCA Review, Sep. 1977, pp. 323-350, vol. 38, No. 3.

Ohta et al., A Practical CMP Profile Model for LSI Design Application, pp. 195-198.

Ouma et al., An Integrated Characterization and Modeling Methodology for CMP Dielectric, Planarization, IEEE 1998.

Runnels et al., A Modeling Tool for Chemical-Mechanical Polishing Design and Evaluation, IEEE Transactions on Semiconductor Manufacturing, Aug. 1998, pp. 501-510, vol. 11, No. 3.

Stapper et al., Integrated Circuit Yield Management and Yield Analysis: Development and Implementation, IEEE Transactions on Semiconductor Manufacturing, May 1995, pp. 95-102, vol. 8, No. 2.

Stine, et al., Rapid Characterization and Modeling of Pattern-Dependent Variation in Chemical-Mechanical Polishing, IEEE Transactions on Semiconductor Manufacturing, Feb. 1998, pp. 129-140, vol. 11, No. 1.

Telfeyan et al., A Multilevel approach to the control of a chemical-mechanical planarization process, J. Vac. Sci. Technol., May/Jun. 1996, pp. 1907-1903, A 14(3).

Sayah, Hoshyar R. & Buehler, Martin G., Comb/ Serpentine/ Cross-Bridge Test Structure for Fabrication Process Evaluation, 1988 IEEE Proceedings on Microelectric Test Structures, vol. 1, No. 1, Feb. 1988.

* cited by examiner

200

300

400

500

TEST STRUCTURES AND MODELS FOR ESTIMATING THE YIELD IMPACT OF DISHING AND/OR VOIDS

This application claims the benefit of U.S. Provisional Patent Application No. 60/316,317, filed Aug. 31, 2001.

FIELD OF INVENTION

This invention relates to methods for measuring and evaluating the process and design related statistical variations of an integrated circuit manufacturing process in order to determine their sources and their effects on the yield and performance of the product.

BACKGROUND

Defects (e.g., residual extra material) can cause electrically measurable faults (killer defects), depending on the chip layout as well as the layer and location of the defects. These faults are responsible for manufacturing-related malfunction of affected chips. So, a layer and fault sensitive defect density is important for yield enhancement and to control quality of process steps and product chips. See Staper, C. H., Rosner, R. J., Integrated Circuit Yield Management and Yield Analysis: Development and Implementation IEEE Transactions on Semiconductor Manufacturing, pp. 95-102, Vol. 8, No. 2, 1995, which is incorporated by reference herein in its entirety. Also see Ipri, A. C., Sarace, J. C. Integrated Circuit Process and Design Rule Evaluation Techniques RCA Review, pp. 323-350, Volume 38, Number 3, September 1977, and Buehler, M. G. Microelectronic Test Chips for VLSI Electronics VLSI Electronics Microstructure Science, pp. 529-576, Vol 9, Chap.9, Academic Press, 1983, both of which are incorporated by reference herein in their entireties. Electrical test structures are used to detect faults and to identify and localize defects.

Topography-related defects are particularly significant in the copper Damascene manufacturing method. In this manufacturing method, trenches and holes are etched in oxide layers, barrier films (e.g., Ta or TaN) and Cu films are deposited to fill the trenches, and chemical mechanical polishing (CMP) is used to remove the Cu overburden. It has been found that the deposition rate and CMP removal rates can have strong, pattern-dependent variations. These variations result in non-uniform layer thicknesses (i.e., topography) within the final patterns of each chip as well as chip-to-chip across wafers and lots. Since most chips have several layers of Cu metallization or other metallization, these thickness variations can further accumulate in each successive layer of processing resulting in complex overall topographical variations. "Extra material" defects are formed when residual material (e.g., Ta barrier metal) remains after any polishing step (i.e., "underpolish"). The usual countermeasure in this situation is to increase the CMP removal rate to achieve sufficient "overpolish." However, too much overpolish can actually remove too much of the Cu metal in a given pattern, resulting in excessive metal resistance or a "missing material" defect. Thus, the final process must balance these concerns to achieve a reasonable "process window," as shown in FIG. 1. FIG. 1 shows the upper metal layer process window as a function of CMP removal rate. In FIG. 1, segment 102 shows the region in which there are shorts due to residual materials resulting from under-polishing. Segment 103 shows the desired process window. Segment 104 shows the region in which there are high resistance lines or metal opens.

Residual barrier or Cu (or other) metal "extra material" defects cause electrical shorts. Residual barrier metal defects are difficult to detect even using optimized inline inspection. Electrical test structures are an attractive alternative for defect detection. Metal "Comb" or "SnakeComb" structures can be used to detect the presence of electrical shorts. FIG. 2 shows a typical metal SnakeComb structure 200, including a snake portion 202, and two comb portions 203, 204. If an extra material defect occurs between the two halves of the comb 203, 204, the resulting electrical short results in excessive leakage current detected during subsequent electrical test. If a missing material defect occurs within the Snake portion 202 of the structure 200, subsequent electrical test shows an open circuit between the two ends of the snake.

Layout patterns on underlying layers can be used to stimulate topography-related failures in metal Combs and SnakeCombs 300 including metal 2 lines 302 and 303, as shown in FIGS. 3A and 3B. FIGS. 3A and 3B show residual metal 2 (M2) 305 shorting lines 302 of a snakecomb structure 300 as a result of dishing in the metal 1 (M1) line (lower layer) 301. The residual M2 metal 305 is in the M1 "dish". The deposited oxide profile 307 and final polished oxide profile 309 are shown. The residual M2 metal 305 lies beneath the final polished oxide profile 309 (because of the M1 dishing) and is not removed by the polishing. However, the design of the underlying patterns 301 must be carefully constructed in order to stimulate the desired failure modes in a manner which uniquely identifies them from other possible failure modes. Furthermore, the effect of the underlying patterns 301 on the yield of the metal SnakeComb 300 is dependent on the design of the SnakeComb itself. Finally, the test structure should be representative of layout patterns typically used in product chips. This ensures that the results from analysis of the test structure will be relevant to product yield. Modern design flows can result in a huge variation of possible product layout patterns. In view of all of these factors combined, a rigorous design-of-experiments (DOE) for test structures for Cu (or other metal) topography analysis are desired for product yield improvement.

SUMMARY OF THE INVENTION

One aspect of the invention is a test structure comprising a test pattern on a substrate. The test pattern comprises a snake structure having a plurality of wells, and a comb structure having a plurality of tines positioned within wells of the snake structure. The tines can be offset from the center of the wells.

Another aspect of the invention is a test structure comprising a test pattern on a substrate. The test pattern comprises first and second comb structures facing each other so as to have a plurality of interlaced tines. The first comb structure has a respective well between each pair of adjacent tines thereof. The tines of the second comb structure are offset from corresponding centers of the wells.

Another aspect of the invention is analyzing test data collected from the test structure having a comb and an offset snake or comb, to estimate product yield thereby.

Another aspect of the invention is a method, comprising the step of designing a lower layer test pattern with a design of experiment to stimulate topographical variations, which propagate to an upper layer pattern, wherein one or more of the topographical variations cause a failure in the upper layer pattern.

Another aspect of the invention is a method, comprising the step of: designing a lower layer test pattern with a first design of experiment to stimulate topographical variations that propagate to an upper layer pattern; designing variations in the upper layer pattern with a second design of experiment; and coordinating the first and second designs of experiment with each other.

DETAILED DESCRIPTION

U.S. Provisional Patent Application No. 60/316,317, filed Aug. 31, 2001, is incorporated by reference herein in its entirety.

Introduction

Cu (or other material) dishing on lower metal layers is known to cause residual barrier metal material on the next metal layer resulting in electrical shorts. Oxide dishing and metal void formation in the lower metal layers have also been observed to lead to electrical shorts in upper metal layers. The probability of these types of failure depends on several factors:

1. the probability of Cu (or other metal) dishing, oxide dishing or Cu (or other metal) voiding in the lower metal layer
2. the probability of transfer of lower layer topography into upper layer oxide topography
3. the removal rate during the final polishing step during upper metal layer formation
4. the presence of upper layer metal in close enough proximity to the residual material defect to result in a short in the upper layer metal.

Prior art metal test structures are not sufficient to characterize this kind of failure due to both test structure design and the DOE used for a suite of such test structures on a die. A new test structure design is presented herein, as well as a summary of the major issues which are considered during DOE in order to make the results of the test structure relevant for product yield improvement.

Test Structure Design

Figure 1:
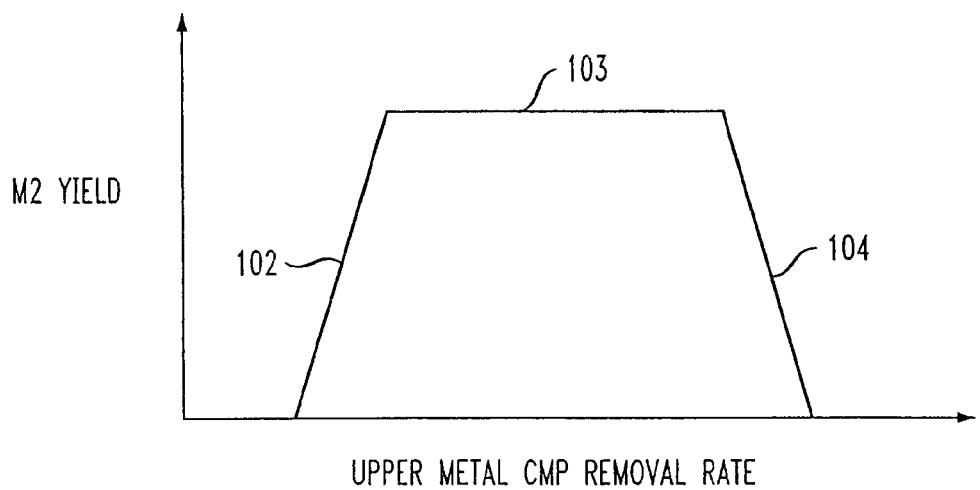
FIG. 1 is a diagram showing how wafer yield is affected by CMP removal rate.
Figure 2:
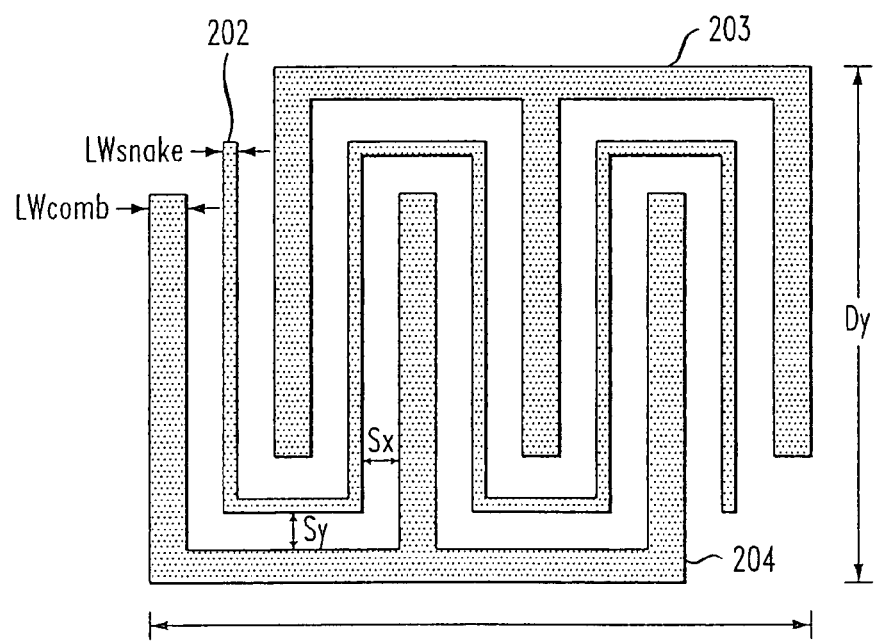
FIG. 2 is a diagram of a conventional SnakeComb test structure.
Figure 3A:
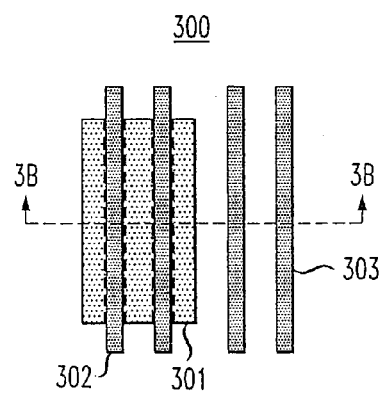
FIGS. 3A (plan view) and 3B (cross sectional view) show an upper layer short circuit from residual upper layer metal caused by dishing in the lower layer metal.
Figure 3B:
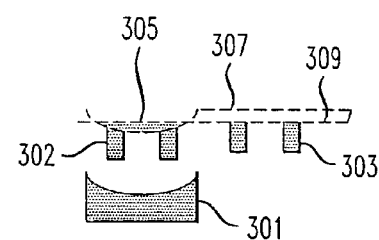

SnakeComb test structure designs typically use equal linewidth and line space for all elements in the SnakeComb, as shown in FIG. 2. This forces a correlation between the critical area and density in the upper layer. Thus, factors 3 and 4, above, are inseparable with standard SnakeComb test structures.

To allow independent control of critical area and metal density in the SnakeComb structure, one exemplary embodiment of the invention includes an "Offset SnakeComb" test structure 400 (shown in FIG. 4) may be used. Critical area is the area occupied by pattern/structure that is susceptible to specifically defined defects. In this test structure, high critical area is achieved by placing each successive pair 403, 404 of "tines" 402 (i.e., a "tine pair") in the SnakeComb 400 at minimum space. This is accomplished by placing the tines 402 of the comb structure within wells 406 of the snake structure, with the tines offset from the center C of the wells. Herein, the term "tines" covers segments 402 of the combs 401 as well as segments 402 of the snake 405. Minimum space is the minimum space S1 allowed between tines 402 within a pair (e.g., pair 403) by the layout rules. S2 defines the distance between tine pairs. A tine pair 403 has spacing S1; to the left of tine pair 403 is a second tine pair 404. Each well 406 has first and second side walls 406a and 406b, and a minimum space between the tines 402 and either of the first and second side walls of one of the wells is a minimum space S1 allowed between any lines for a circuit pattern on the substrate. Density is then independently controlled by varying the space between "tine pairs." Metal density is defined as $(2*L)/(S1+L+S2+L)$ where L is the width of the lines. For example, in the DOE of Table 1 (below), maximum density is actually approximately 80-90%% since minimum S is approximately 0.2 μm and L is approximately 1-1.2 μm.

| Values | Elements | | |
|---|---|---|---|
| | Metal 1 width (W1) um | Metal 1 density (D1) | Metal 2 comb space (S2) um |
| 1 | 4 | 30% | 40.08 |
| 2 | 10 | 50% | 18.88 |
| 3 | 20 | 83% or 90% | 4.74 |
| 4 | | | 1.92 |
| 5 | | | 0.94 |
| 6 | | | 0.2 |

Figure 4:
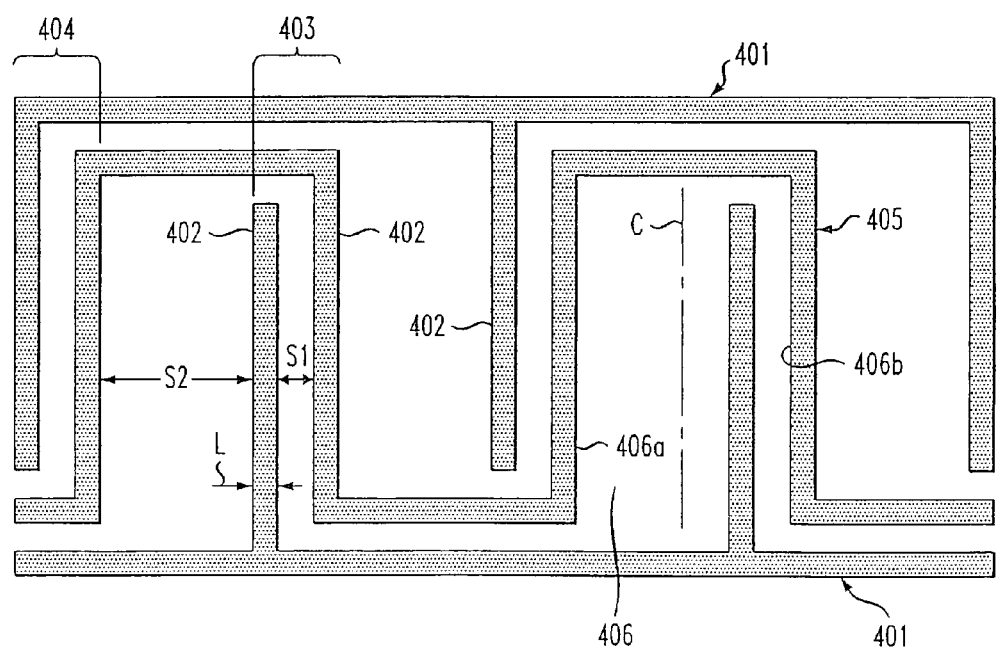
FIG. 4 is a plan view of an exemplary SnakeComb test structure according to the present invention.
Figure 5:
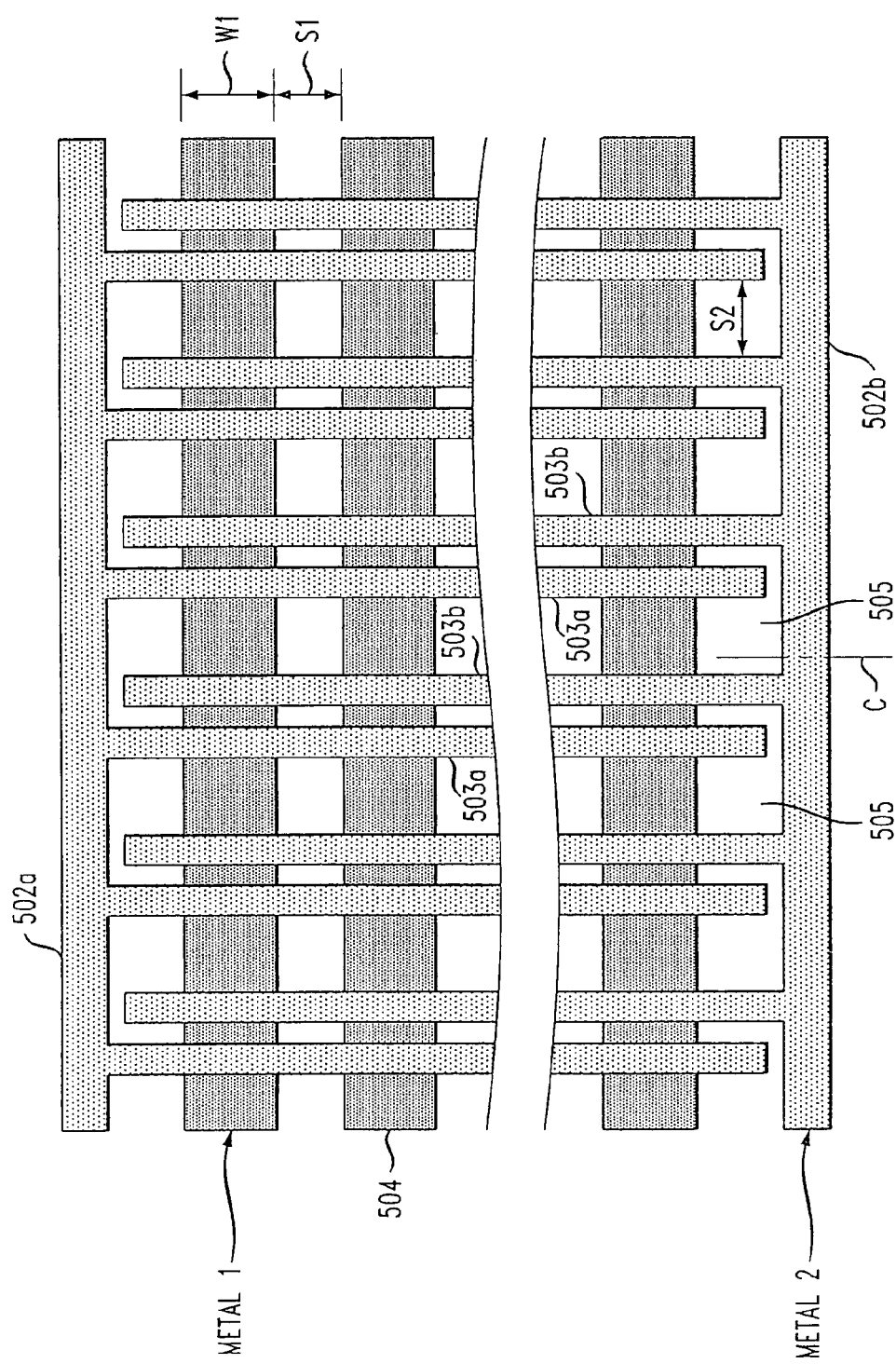
FIG. 5 is a plan view of an exemplary layout including the Comb test structure of FIG. 4.

FIG. 5 is a plan view of a second exemplary layout including two of the Comb test structures 502 of FIG. 4. The test pattern 500 comprises: first and second comb structures 502a, 502b facing each other so as to have a plurality of interlaced tines 503a and 503b, the first comb structure 502a having a respective well 505 between each pair of adjacent tines 503a thereof. The tines 503b of the second comb structure 502b are offset from corresponding centers C of the wells 505.

In FIG. 5, the density D1 of metal 1 (item 504) is given by $D1=W1/(W1+S1)$. Table 1 provides the comb-metal dishing DOE. An exemplary test procedure for this DOE is as follows: In a full factorial DOE, there are 54 structures.

Lower layer patterns are drawn using a similar philosophy. The lower layer test patterns have a design of experiment to stimulate topographical variations, which propagate to the upper layer pattern. This allows extraction of failure rates and determination of a relationship between the failure rate and the critical area of the lower layer test pattern. Since the lower layer patterns are drawn solely to provide topography for the electrically tested upper layer, they are not connected in an electrically testable configuration (e.g., a Comb) and are simply drawn as "dummy patterns." The design of the dummy patterns is related to the actively measured patterns above.

Although the exemplary embodiment uses dummy patterns in the lower layer, many different kinds of patterns could stimulate topography which could propagate to the upper layer and cause an electrically observable short or open circuit. For example, Cu voids can form only in corners of small metal patterns (such as text or islands). So one could build an array of such patterns under the upper layer SnakeComb to stimulate topography and killer shorts. Any kinds of under layer patterns which can cause upper layer topography may be used. One of ordinary skill in the art will understand that the appropriate DOE corresponding to any given under layer patterns is based on knowledge or hypotheses of the topography generation mechanism.

The dummy patterns may have special design features. Each dummy pattern may be specifically designed in order to stimulate a particular sort of failure. For example, to stimulate Cu and oxide dishing, long lines of varying width and space are used. To stimulate Cu voids, Cu lines, as well as Cu islands and other small, corner-dominated Cu structures are used. In general, any kind of dummy pattern which can stimulate topography in the upper layer may be used. Examples of such other dummy patterns include, but are not limited to, samples of typical product layout patterns such SRAM cell arrays or blocks of random logic or standard cells.

The exemplary method and device provide a suite of SnakeComb structures 400 or dual offset comb test structures 500 with variable line spacings that allow for separation of the effects of defects in the upper layer due to specific mechanisms, e.g., shorts, opens caused by the Cu (or other material) dishing interactions with CMP removal rate, from the presence of similar upper layer metal defects caused by other failure mechanisms. Thus a plurality of such test structures may be formed, each test structure having a respectively different minimum line spacing.

Figure 11:
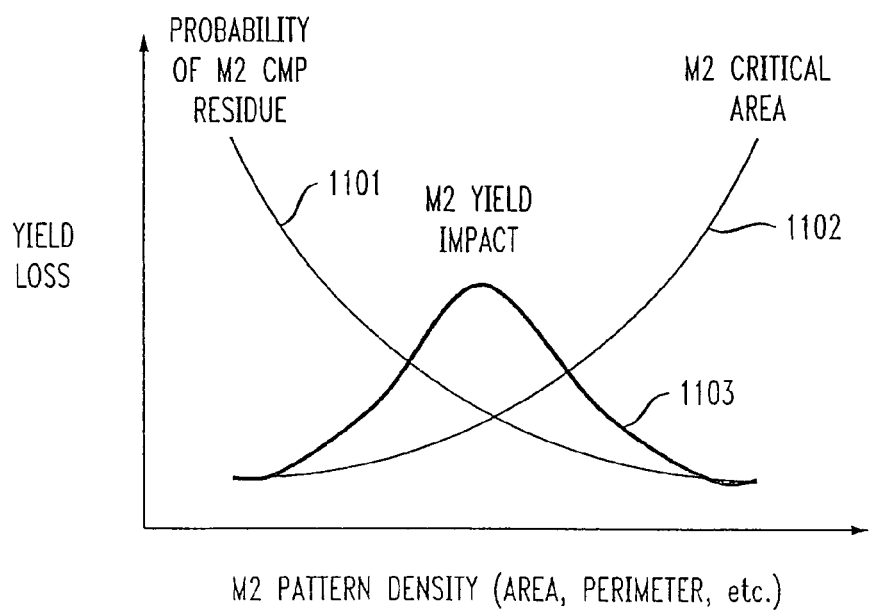
FIG. 11 is a graph showing how the density of the upper layer (M2) pattern affects yield.

FIG. 11 is a graph illustrating how the density of the upper layer (M2) pattern may affect its yield. The term "L/S" stands for line/space. Curve 1101 shows the probability of M2 CMP residue as a function of M2 pattern density. This parameter is varied by changing the M1 linewidth pattern under the M2 comb. Curve 1102 shows the M2 critical area as a function of M2 pattern density. This parameter is varied by changing the S2-spacing between minimum L/S pairs in the M2 comb. Curve 1103 shows the M2 likely yield impact trend vs. density as M2 puddle probability increases while M2 critical area decreases.

Design-of-Experiments and Data Analysis

Prior art test chips used for Cu topography analysis do not allow straightforward disaggregation of the various possible failure modes which can be present in any single set of data. To facilitate this task, we consider how each failure mode is stimulated by layout design as well as how the frequency of a defect (i.e., the "defect density") can be modeled in a form useful for product yield prediction. These considerations then dictate the design-of-experiments (DOE) for the test structure layout patterns.

Another aspect of the exemplary embodiment provides a DOE system that takes into account both the defect density and how a failure mode is affected by the design layout.

The exemplary method comprises designing a lower layer test pattern with a first design of experiment (having dummy patterns) to stimulate topographical variations that propagate to an upper layer pattern. Variations in the upper layer pattern have a second design of experiment. The first and second designs of experiment are coordinated to interact with each other. For example, the first (lower layer) design of experiment may include providing structures that maximize observability of a given type of defect (e.g., M2 short) in the upper layer pattern. The second design of experiment could then include provision of structures having respectively different abilities to avoid that given type of defect. The second design of experiment may include provision of structures having respectively different sensitivities to the density of that given type of defect.

Figure 6:
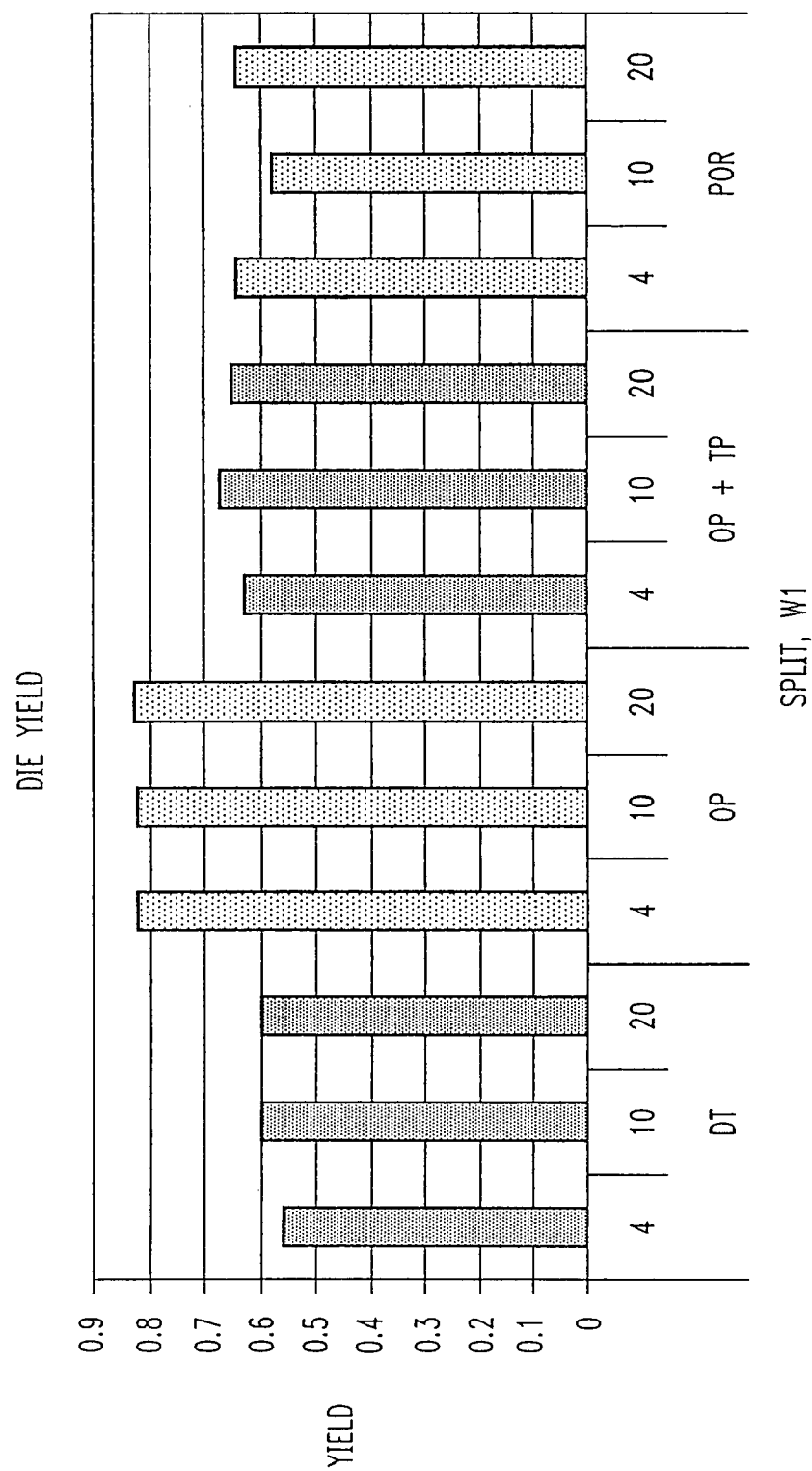
FIG. 6 is a histogram showing die yield under various conditions, split W1.
Figure 7:
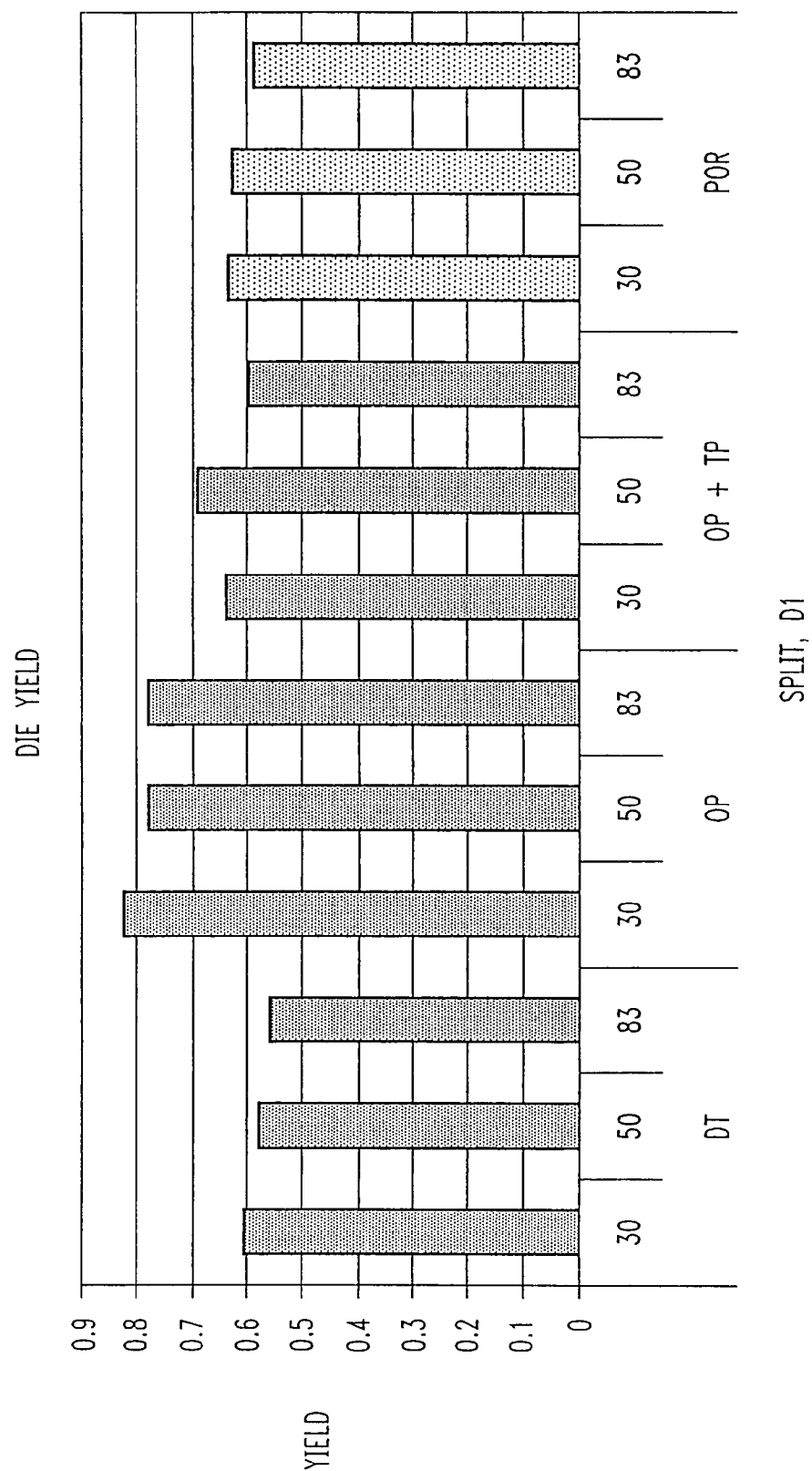
FIG. 7 is a histogram showing die yield, split D1.
Figure 8:
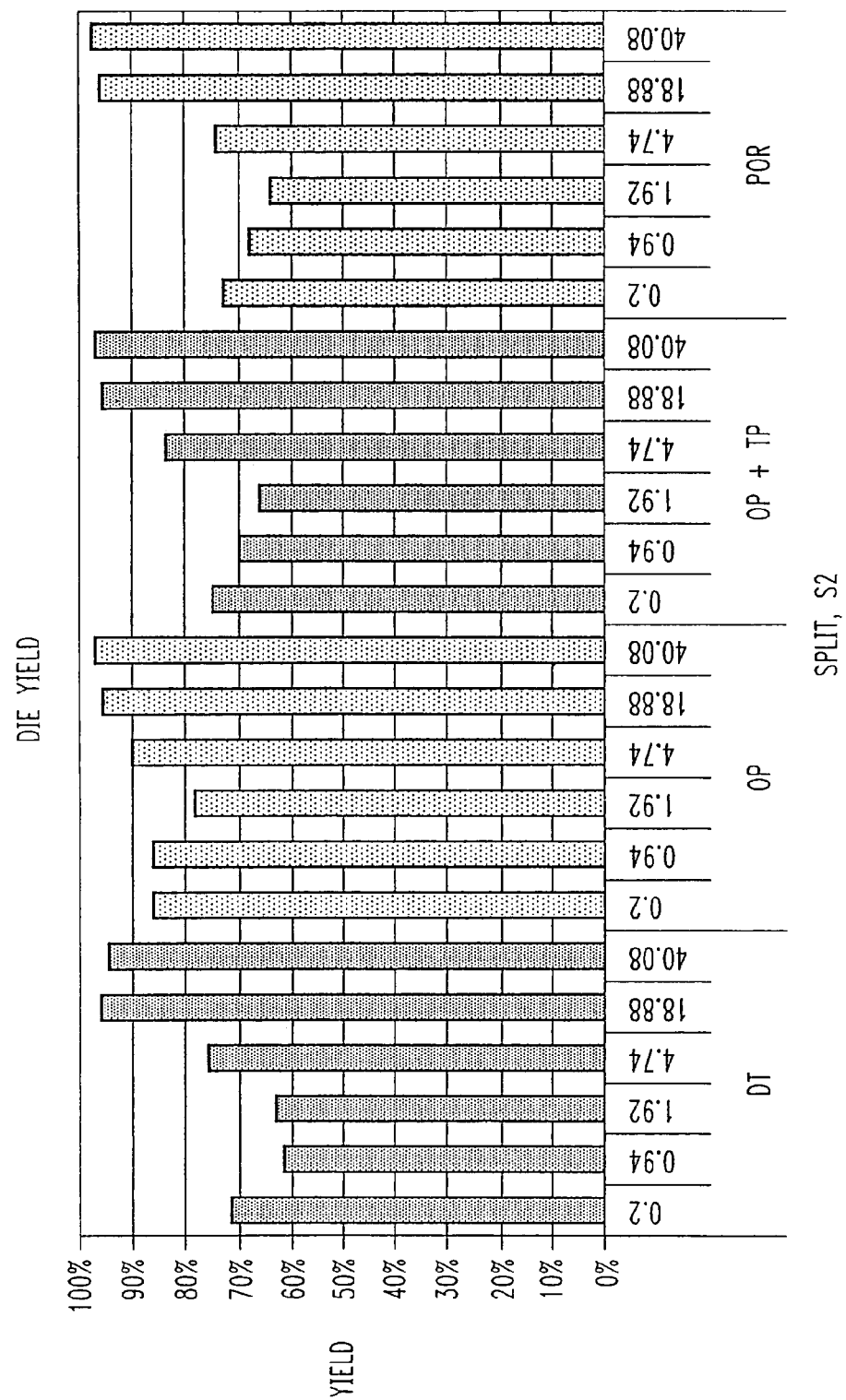
FIG. 8 is a histogram showing die yield, split S2.

In FIGS. 6-8, the term "split" is still used to identify two different runs. When one did an experiment with n variables that was split conventionally, it meant that another experiment is designed in which one of the variables is different, hence the two process runs were said to be "split". However, DOE is a formalized methodology to do experiments with different variable arrangements exacting maximum information with a minimum number of experiments. In the case of a DOE split as described herein, more than one variable may be changed at a time in a novel way. Therefore the one at a time variable approach is replaced by DOE. The term "split" is used herein to identify two different runs.

Note that in FIGS. 6-8, the acronyms DT, OP, TP and POR do not refer to the exemplary SnakeComb test structures on the die, but refer to the "split" conditions used during wafer processing. These conditions may be any processing conditions that are specific to a product. These data are provided for the purpose of showing the method of analysis, and not for the purpose of highlighting the specific conditions DT, OP, TP and POR that were used for this sample.

In FIGS. 6-8, die yield is defined so that a die is considered good if all the structures in the same category are good.

FIG. 6 is a histogram showing die yield under various conditions (designated DT, OP, OP+TP, POR), "split W1." That is, the bars labeled "4" have similar values of W1 to each other, the bars labeled "10" have similar values of W1 to each other, and the bars labeled "20" have similar values of W1 to each other. In FIG. 6, a die is considered good if all the structures with the same width are good. Among the various split conditions in FIG. 6, the OP split consistently has the best yield; the DT and POR splits have worse yields.

FIG. 7 is a histogram showing die yield, split D1. That is, the bars labeled "30" have the same values of D1 as each other; the bars labeled "50" have the same values of D1 as each other, etc. In FIG. 7, a die is considered good if all the structures with the same metal 1 density are good. Among the various split conditions in FIG. 7, the OP split consistently has the best yield; the DT and POR splits have worse yields.

FIG. 8 is a histogram showing die yield, split S2. That is, the bars labeled "0.2" have the same values of S2 as each other; the bars labeled "0.94" have the same values of S2 as each other, etc. In FIG. 8, a die is considered good if all the structures with the same metal 2 comb space are good. Among the various split conditions in FIG. 8, the OP split has the best yield for values of S2 up to 4.74; the DT and POR splits have worse yields for values of S2 up to 4.74. For values of S2 of 18.88 and 40.08, there is little difference in yield among the various conditions.

Exemplary analysis results for the data of FIGS. 6-8 areas follows: Of the split conditions used during wafer processing, the split condition designated "OP" has higher yield than other splits. No close relationship of yield to metal 1 width is apparent. No close relationship of yield to metal 1 density is apparent. The yield has a close relationship to metal 2 comb space/density.

In general, the data collected from the experiment are analyzed to determine whether there is correlation between each individual design feature under investigation and the yield, and whether there is correlation between each individual split process condition and yield.

Figure 9:
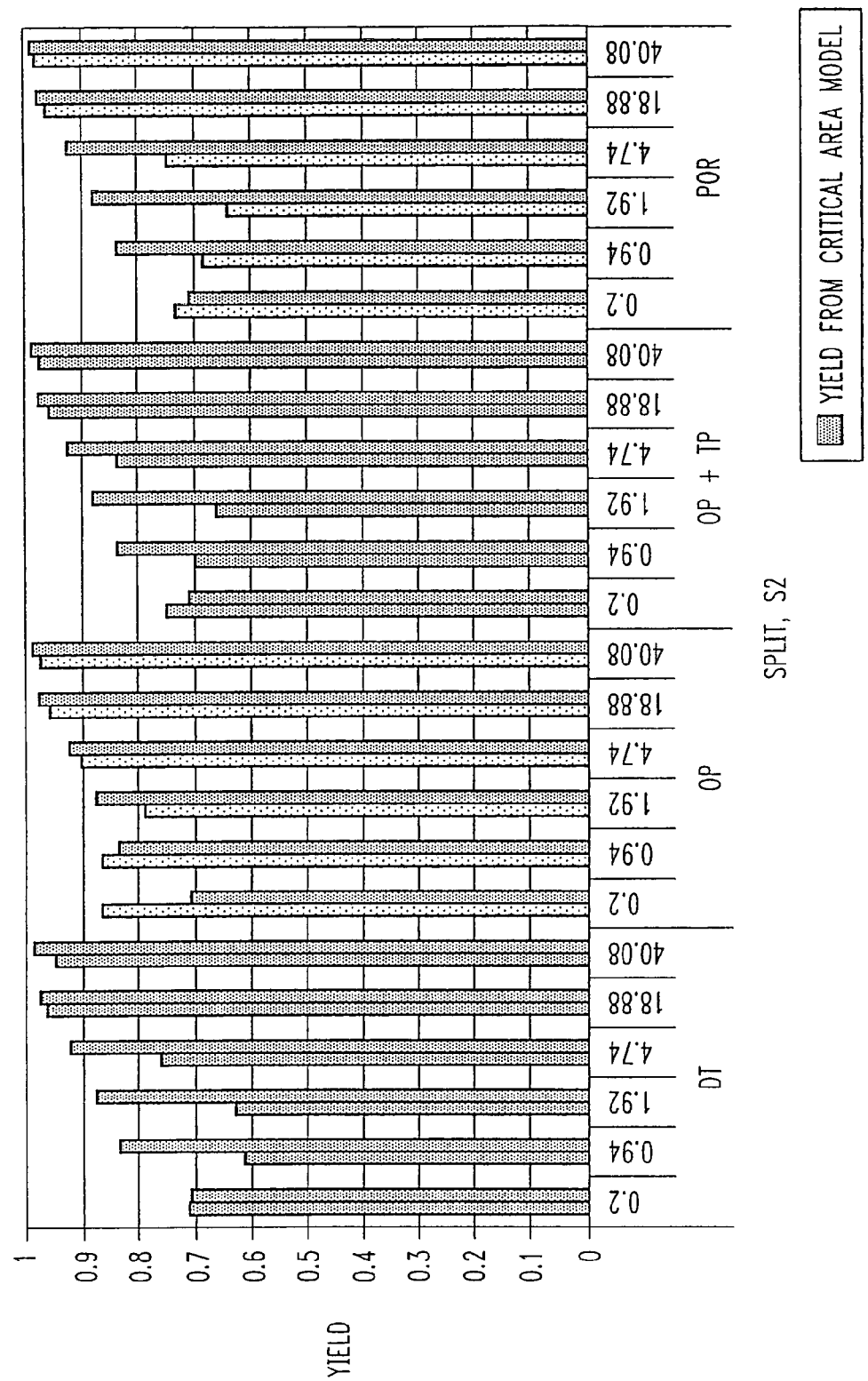
FIG. 9 is a histogram comparing experimental yield results (left bar in each pair) with predicted yield (right bar in each pair).

FIG. 9 is a histogram comparing experimental yield results (from FIG. 8) with predicted yield. The experimental results are indicated by the left bar in each pair of adjacent bars. The predicted yield results from the critical area model are indicated by the right bar in each pair of adjacent bars. When the metal 2 density is at a median level, there is a large difference between the observed yield and the predicted yield by the critical area model. From critical area model, yield loss should monotonically increase with higher metal 2 density. From observed yield, the yield loss has a quadratic relationship to the metal 2 density.

Figure 10:
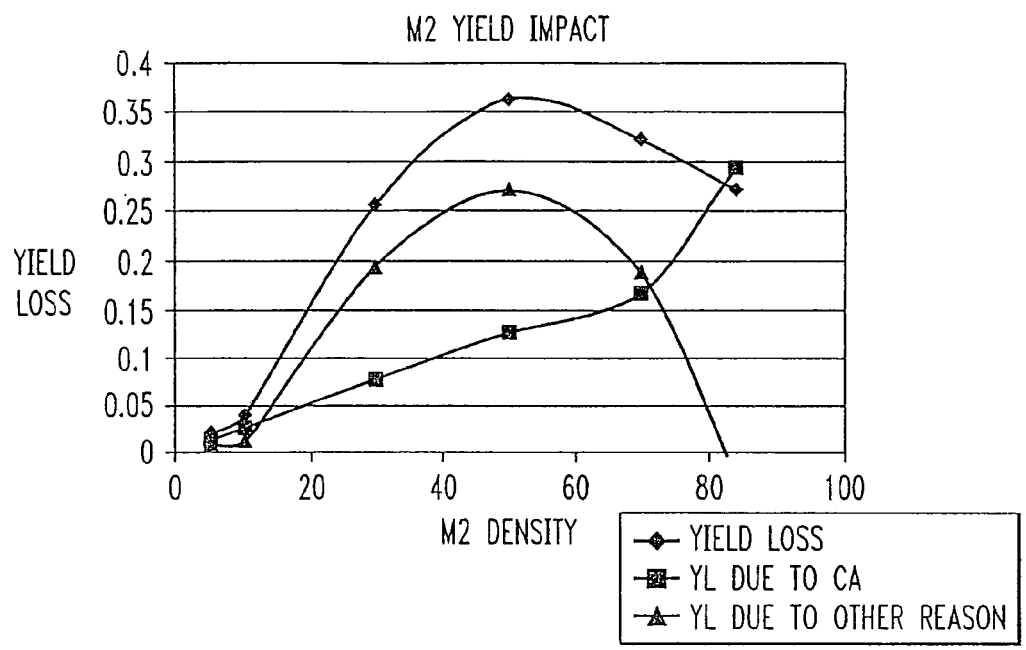
FIG. 10 is a graph of yield loss due to critical area and other reasons.

FIG. 10 is a graph of total yield loss, predicted yield loss due to critical area, and inferred yield loss due to other reasons, as a function of the density of metal 2 in the experiments described above with reference to FIGS. 6-9. These values are defined by the equations below:

$$\text{Yield loss} = 1 - Yield_{observed} \tag{1}$$

$$YL \text{ due to } CA = 1 - Yield_{predicated\ by\ CA} \tag{2}$$

$$YL \text{ due to other reason} = 1 - \frac{Yield_{observed}}{Yield_{predicated\ by\ CA}} \tag{3}$$

The following conclusions may be drawn from the exemplary yield analysis: The critical area model cannot explain the large yield loss for medium metal 2 density structures shown in FIG. 10 (in the curve designated "YL due to other reason"); there should be another systematic yield loss mechanism. The metal 2 comb space/metal 2 density has quadratic impact on yield loss for the examples described above with reference to FIGS. 6-9. Thus, test concept originally illustrated in FIG. 11 has been realized in silicon and demonstrates the utility of the test structure design practices and analysis methods embodied in this invention.

Process Fail Rate Estimation and Product Yield Impact Estimation

New yield models are desired for the new mechanisms of metal 2 shorts. Such new models may include: a metal void model, a metal dishing model, a metal erosion model, a Cu-up model, and the like. These yield models are formulated as a function of design pattern attributes (e.g. critical area) and process fail rate quantities (e.g. defect density). The drawn design patterns of those test structures area used to estimate the critical area for each kind of process fail mechanism. Thus, the yields of a set of test structures can be used along with the drawn design patterns for those test structures to invert the yield model function and estimate the process fail rate quantities. The process fail rate quantities are then used in conjunction with appropriate critical areas extracted from product patterns to estimate product yield impact of the process fail mechanism.

Yield prediction methods are described in U.S. patent application Ser. No. 10/202,278, filed Jul. 24, 2002, and Ciplickas, Dennis et al., "Predictive Yield Modeling of VLSIC's", IEEE International Workshop on Statistical Metrology, Honolulu, Hi., June 2000, both of which are expressly incorporated by reference herein.

Yield impact predictions are calculated by combining the process defectivity rates (D0, p, λ, etc.) with critical areas calculated from product chip layouts. This section describes this analysis flow.

The overall model is formed by building yield predictions of individual circuit blocks broken down by each processing layer. For example, if a chip contains random logic with an SRAM core and is manufactured in a two level metal process, the yield impact matrix shown in Table 2 is formed. Each cell of the matrix contains a yield impact prediction for the given chip block and processing layer. The last row and column of the matrix contain the product of all cells in that column or row. For example, the product of the 10 upper left most cells (first 5 columns and first 2 rows) evaluates to the total chip yield across all layers.

TABLE 2

| | pdy | contact | metal 1 | via | metal 2 | Total Layers |
|---|---|---|---|---|---|---|
| Logic | | | | | | |
| SRAM | | | | | | |
| Total Chip | | | | | | |

Individual yield predictions are calculated using the average failure rate of the layout in a given block and layer. The average failure rate, λ, is a well established parameter used to modeling the yield impact of random defects. For example, given a block failure rate λa associated with a certain defect type a, a Poisson distribution can be used to estimate the fraction of chips which are not affected by the defect:

$$Y_a = e^{-\lambda_a} \tag{4}$$

is known as the limited yield for defect type a. Other distributions, such as the Negative Binomial distribution, can also be used to estimate limited yields. These other distributions are most appropriate when the failures modeled by λa exhibit some degree of clustering. For both clarify and brevity, however, the Poisson distribution is used to illustrate the concepts and clustered yield models are not discussed here. Failure rates for planar interconnect layers of layout blocks can be calculated using a traditional critical area:

$$\lambda_{b,l} = \int_{x_0}^{\infty} [CA_{e,l}(x)][DSD_l(x)dx] \tag{5}$$

where
b=layout block
l=process block
$x_0$=minimum feature size in technology
x=defect size
$CA_{b,l}(x)$=critical area of block b in layer l for defect size x
$DSD_l(r)$=deensity of defects in layer l with size x Failure rates of the via hole layers in layout blocks are calculated using the single via or contact failure rate and the number of contacts or vias in the block:

$$Y_{b,l_{via}} = e^{-\lambda_{l_{via}} N_{b_{via}}} \tag{6}$$

The use of generalized failure rates per layer and block allows the yield impact matrix to model a variety of situations. The breakdown of embedded SRAM vs. random logic shown in table 2 is a non-limiting example of one typical configuration. If multiple, independently tested blocks are present in a design, it is recommended to break the yield impact matrix into rows corresponding to each block. Similarly, even though the above examples illustrate how to build yield impact matrices from classical process fail rate quantities (D0, p, λ), the methodology allows for other process fail rate quantities to be used (e.g., Dv(x), PL(m2s,m1w), and PL(d1,d2,x)). Product yield models based on these process fail rates would form new columns in the yield impact matrix.

Figure 12:
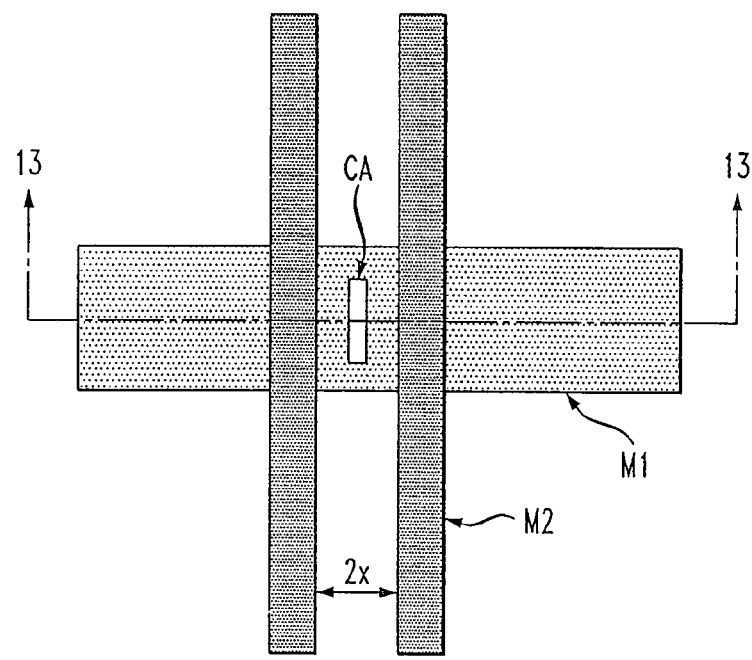
FIGS. 12 and 13 are plan and cross sectional views of a sample having voids in the lower layer.
Figure 13:
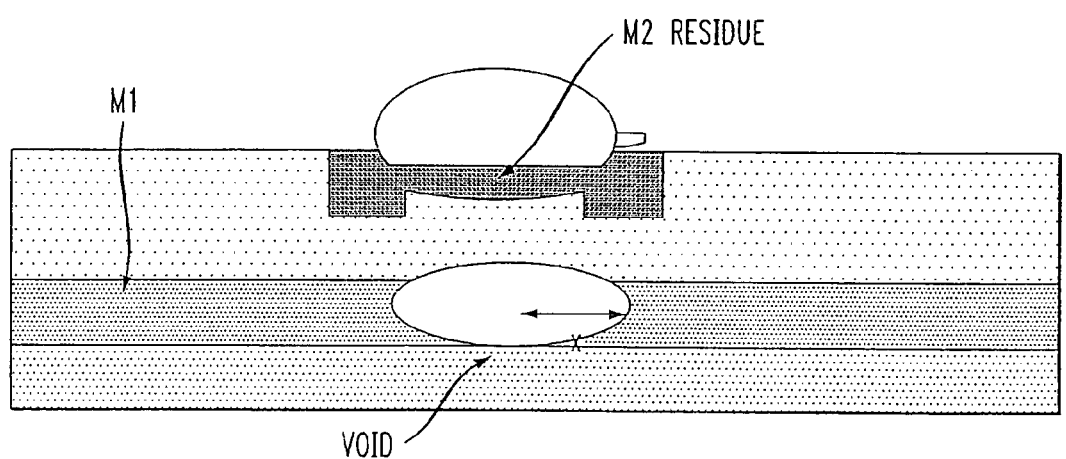

FIGS. 12 and 13 are plan and cross sectional views, respectively, of a sample having voids in the lower layer. The yield loss mechanism may be described as follows. The void in metal 1 causes the metal 2 comb short. The model can be similar to the critical area short model, except the M2 defects are induced by the voids in M1. Thus, the M2 defect density is actually the M1 "void density." The pertinent M2 layout parameter is CA(x), where CA is the critical area, and x is the radius of the void. The pertinent process parameter is M1 void size distribution Dv(x). These parameters are related by the following equation:

$$\text{Yield} = e^{-\int CA(x)*Dv(x)dx} \quad (7)$$

Layout extraction is given by:

$$CA(x) = (((\&(m2>x))\&(m1<x)),$$

where:

A&B is the boolean "AND" of layers A and B;

!A is the boolean "NOT" or "inverse" of layer A; and

L>x oversizes layer L by amount x;

L<x undersizes layer L by amount x;

(&L) is the layer formed by the overlapping polygon regions in layer L.

The process parameter Dv(x) is estimated by solving equation (7) given Yield and CA(x) for a set of test structures designed according to a DOE with philosophy described earlier. Given CA(x) extracted from a product layout, Dv(x) and equation (4) can be used to estimate product yield due to the failure mechanism modeled by this critical area and measured by the given test structure yields.

Figure 14A:
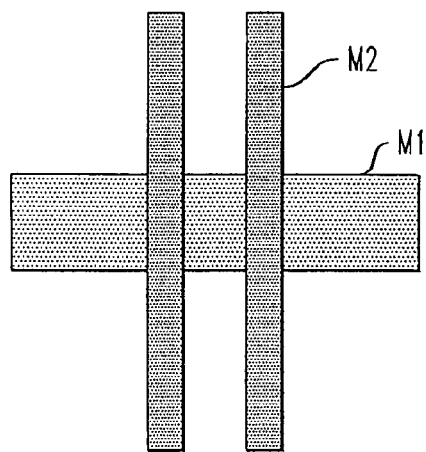
FIGS. 14A-14D show each step of the calculation for critical area.
Figure 14B:
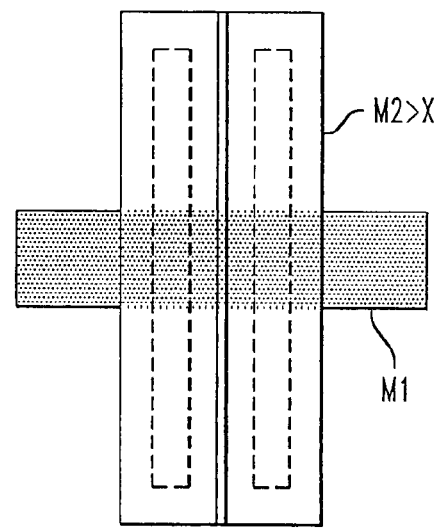

FIGS. 14A-14D show each step of the calculation for critical area. The formula is given above. FIG. 14A is the original layout. In FIG. 14B, (m2>x) oversize m2 by x.

Figure 14C:
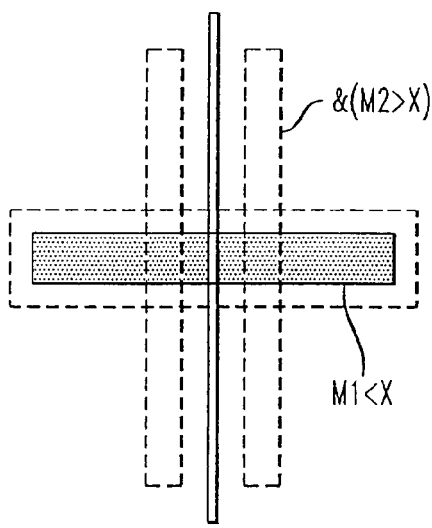
Figure 14D:
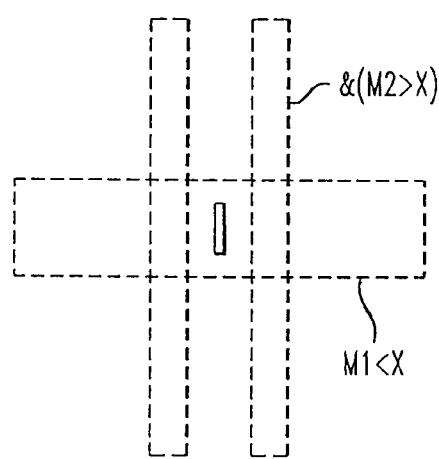

FIG. 14C, shows ((&(m2>x)) and (m1<x). Finally, FIG. 14D, shows the AND of (((&(m2>x)) with (m1<x))resulting in a final polygon with area CA(x).

Although the exemplary method and device is described with reference to copper dishing problems, the invention may be practiced to investigate other metals like tungsten that are used with the CMP process. The invention may be practiced with any metal in combination with any oxide involved in a chemical mechanical planarization process (CMP). In some designs, copper may not be adequate for smaller dimensions because the dimensions approach the mean free path of electrons. Also very low k dielectrics other than the present oxides may also be needed in particular designs. One of ordinary skill can readily optimize the structures and techniques described herein to take into account the differences in the materials properties.

Figure 15A:
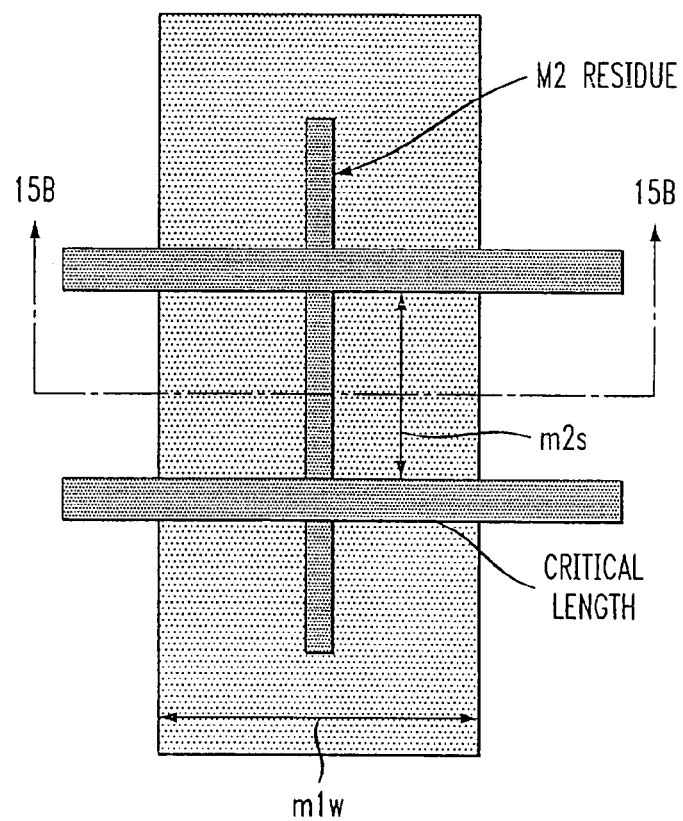
FIGS. 15A and 15B show a metal dishing sample in plan and cross sectional views, respectively.
Figure 15B:
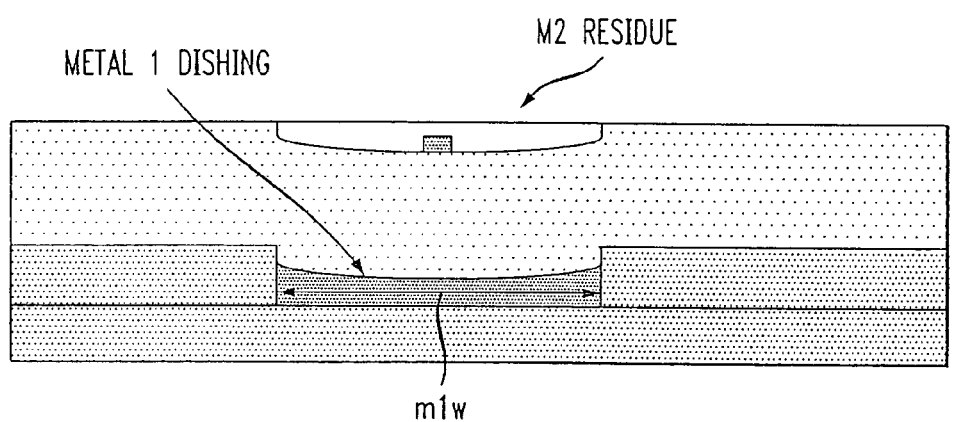

FIGS. 15A and 15B show a metal dishing sample in plan and cross sectional views, respectively. The yield loss mechanism for metal dishing is as follows: CMP causes dishing of the wide metal 1 lines, then metal 2 comb will short. An exemplary model is as follows.

The pertinent layout parameter is: CL(m2s, m1w) is defined as the critical length, the length of the metal 2 with a space of m2s on metal 1 lines of width of m1w.

The pertinent process parameter is: PL(m2s,m1w), defined as the probability of shorting in M2 patterns forming the critical length CL(m2s,m1w).

The yield equation for metal dishing is given by:

$$\text{Yield} = e^{-\int CL(m2s,m1w)*PL(m2s,m1w)dm2sdm1w} \quad (8)$$

Layout extraction is performed as follows:

$$CL(m2s,m1w) = \text{Length}(m2s,m1w) = \text{Length}(m2s,m1w)$$

$$\text{Length}(m2s,m1w) \leftarrow SW(m2\&((!(!(m1<0.5*m1w)) >0.5*m1w)),$$

where:

A*B is the boolean "OR" of layers A and B.

SW(L) is the spacing distribution of layer L

The process parameter PL(m2s,m1w) is estimated by solving equation (5) given Yield and CL(m2s,m1w) for a set of test structures designed according to a DOE with philosophy described earlier. Given CL(m2s,m1w) extracted from a product layout, PL(m2s,m1w) and equation (5) can be used to estimate product yield due to the failure mechanism modeled by this critical length and measured by the given test structure yields.

Figure 16A:
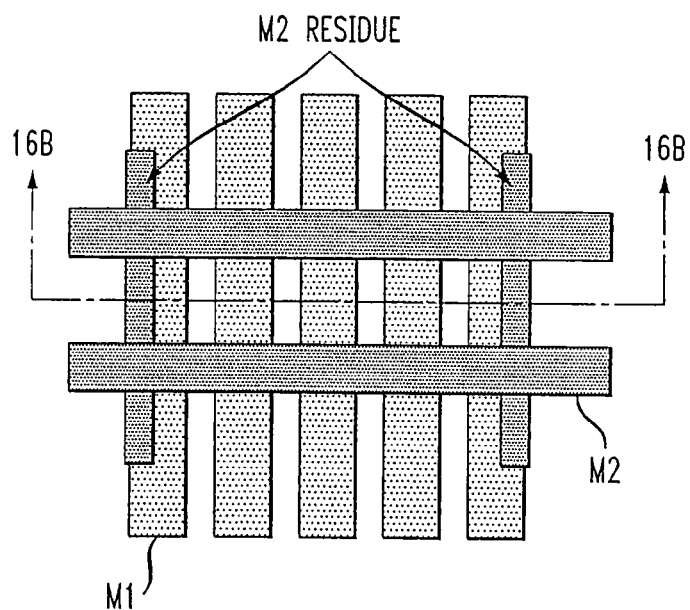
FIGS. 16A and 16B are plan and cross sectional views, respectively, of a metal erosion sample.
Figure 16B:
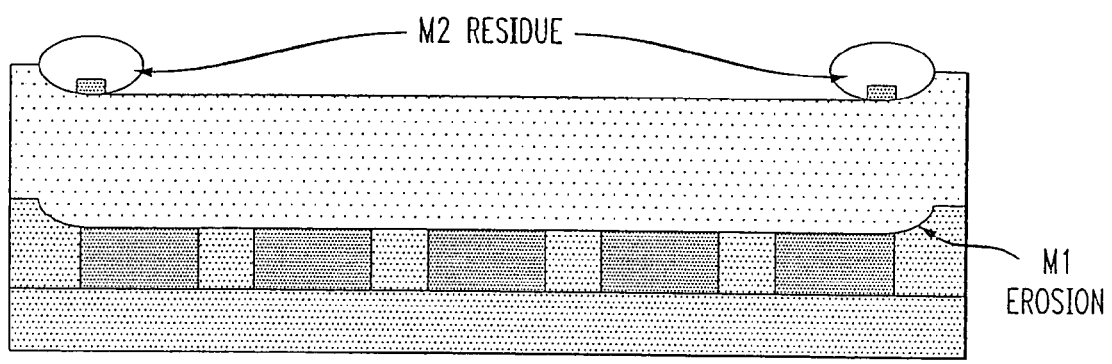

FIGS. 16A and 16B are plan and cross sectional views, respectively, of a metal erosion sample. The defect mechanism is that the erosion of metal 1 causes the metal 2 comb to short.

Layout parameters: CL(d1,d2,x) is defined as the critical length, the length of the metal 2 with space of x within regions with metal 1 density d1 and metal 2 density d2.

Process parameters: PL(d1,d2,x) is defined as probability of shorting for that critical length.

The yield is defined by the equation:

$$\text{Yield} = e^{-\int CL(d1,d2,x)*PL(d1,d2,x)dd1dd2dx} \quad (9)$$

The process parameter PL(d1,d2,x) is estimated by solving equation (6) given Yield and CL(d1,d2,x) for a set of test structures designed according to a DOE with philosophy described earlier. Given CL(d1,d2,x) extracted from a product layout, PL(d1,d2,x) and equation (6) can be used to estimate product yield due to the failure mechanism modeled by this critical length and measured by the given test structure yields.

The exemplary embodiment uses patterns related to interconnect lines to discriminate between particles and CMP defects. Therefore higher conductivity metals appear to be most relevant for use in structures according to the invention. Refractory metals like tungsten are used in via fabrication (contacts). But other high conductivity metals for interconnect lines (e.g., aluminum) may be used.

The algorithm applies to any damascene processing method, such as W-damascene, which are used for contacts (or AlCu damascene).

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A test structure comprising a test pattern on a substrate, the test pattern comprising:
    a snake structure having a plurality of wells, and
    a comb structure having a plurality of tines positioned within wells of the snake structure,
    wherein the tines are offset from a center of the wells.

2. The test structure of claim 1, wherein each well has first and second side walls, and a minimum space between the tines and either of the first and second side walls of one of the wells is a minimum space allowed between any lines for a circuit pattern on the substrate.

3. A set of test structures, each comprising a test pattern on a substrate, the test pattern comprising:
    a snake structure having a plurality of wells, and
    a comb structure having a plurality of tines positioned within wells of the snake structure,
    wherein the tines are offset from a center of the wells, and each test pattern has a respectively different maximum distance between a side wall of one of the wells thereof and the tine of the comb structure within the one well.

4. A test structure comprising a test pattern on a substrate, the test pattern comprising:
    first and second comb structures facing each other so as to have a plurality of interlaced tines, the first comb structure having a respective well between each pair of adjacent tines thereof;
    wherein the tines of the second comb structure are offset from corresponding centers of the wells.

5. The test structure of claim 4, wherein a minimum space between one of the tines of the second comb structure a nearest tine of the first comb structure is a minimum space allowed between any lines for a circuit pattern on the substrate.

6. A method for analyzing test data using the test structure of claim 1, comprising the steps of:
    forming the test structure comprising the test pattern on the substrate, the test pattern comprising:
        the comb structure having the plurality of tines, and
        the snake structure having a plurality of side walls, the tines of the comb structure being positioned within side walls of the snake structure,
        wherein the tines of the comb structure are offset from a center of the side walls; and
    analyzing test data collected from the test structure, to estimate product yield thereby.

7. A method of designing the test structure of claim 1, comprising the step of:
    designing a lower layer test pattern with a design of experiment to stimulate topographical variations that propagate to an upper layer pattern, wherein one or more of the topographical variations cause a failure in the upper layer pattern.

8. The method of claim 7, further comprising extracting a failure rate and determining a relationship between the failure rate and a critical area of the lower and upper layer test patterns.

9. The method of claim 7, wherein the upper layer pattern includes:
    a snake structure having a plurality of wells, and
    a comb structure having a plurality of tines positioned within wells of the snake structure,
    wherein the tines are offset from a center of the wells.

10. A method of designing the test structure of claim 1, comprising the step of:
    designing a lower layer test pattern with a first design of experiment to stimulate topographical variations that propagate to an upper layer pattern;
    designing variations in the upper layer pattern with a second design of experiment; and
    coordinating the first and second designs of experiment with each other.

11. The method of claim 10, wherein the first design of experiment includes providing structures that maximize observability of a given type of defect in the upper layer pattern.

12. The method of claim 11, wherein the second design of experiment includes providing structures having respectively different abilities to avoid the given type of defect.

13. The method of claim 11, wherein the second design of experiment includes providing structures having respectively different sensitivities to a density of the given type of defect.

14. The test structure of claim 1, wherein the test structure has a lower layer pattern, such that topographical variations of the lower layer pattern propagate to an upper layer pattern of the test structure, wherein one or more of the topographical variations cause a failure in the upper layer pattern.

15. The test structure of claim 14, wherein the snake structure and the comb structure are in the upper layer pattern.

* * * * *